United States Patent
Shi et al.

(10) Patent No.: US 9,214,635 B2
(45) Date of Patent: Dec. 15, 2015

(54) ANTHRADITHIOPHENE-BASED SEMICONDUCTING POLYMERS AND METHODS THEREOF

(71) Applicants: Phillips 66 Company, Houston, TX (US); Solarmer Energy, Inc., El Monte, CA (US)

(72) Inventors: Chenjun Shi, El Monte, CA (US); Ruby Chen, El Monte, CA (US); Jun Yang, El Monte, CA (US); Christopher S. Daeffler, El Monte, CA (US); Janice Hawkins, El Monte, CA (US); Yue Wu, El Monte, CA (US); Wei Wang, El Monte, CA (US); Kathy Woody, Bartlesville, OK (US); Joe Bullock, Bartlesville, OK (US); Hui Huang, Bartlesville, OK (US); Amit Palkar, Bartlesville, OK (US); Ting He, Bartlesville, OK (US)

(73) Assignees: Phillips 66 Company, Houston, TX (US); Solarmer Energy, Inc., El Monte, CA (US)

( * ) Notice: Subject to any disclaimer, the term of this patent is extended or adjusted under 35 U.S.C. 154(b) by 0 days.

(21) Appl. No.: 14/532,229

(22) Filed: Nov. 4, 2014

(65) Prior Publication Data
US 2015/0136224 A1    May 21, 2015

Related U.S. Application Data

(60) Provisional application No. 61/907,065, filed on Nov. 21, 2013.

(51) Int. Cl.
| C08G 61/12 | (2006.01) |
| H01L 51/00 | (2006.01) |
| H01L 51/42 | (2006.01) |

(52) U.S. Cl.
CPC .......... *H01L 51/0036* (2013.01); *C08G 61/126* (2013.01); *H01L 51/0043* (2013.01); *H01L 51/0074* (2013.01); *C08G 2261/12* (2013.01); *C08G 2261/18* (2013.01); *C08G 2261/3243* (2013.01); *C08G 2261/91* (2013.01); *H01L 51/4253* (2013.01); *H01L 2251/308* (2013.01)

(58) Field of Classification Search
CPC ............ H01L 51/0036; H01L 51/0043; H01L 51/0074; H01L 51/4253; C08G 2261/12; C08G 2261/32; C08G 2261/91; C08G 61/126
See application file for complete search history.

(56) References Cited

FOREIGN PATENT DOCUMENTS

WO    WO-03032072 A2    4/2003

OTHER PUBLICATIONS

Balandier, et al., Dimers of Anthrathiophene and Anthradithiophene Derivatives: Synthesis and Characterization, Organic Letters 13(4), 548-551 (2011).*
Laquindanum, et al., *Synthesis, morphology, and field-effect mobility of anthradithiophenes*, J. Am. Chem. Soc. 120(4) (1998) 664-672.
Liang, et al., *Development of new semiconducting polymers for high performance solar cells*, J. Am. Chem. Soc. 131(1) (2009) 56-57.

* cited by examiner

*Primary Examiner* — Erich A Leeser
(74) *Attorney, Agent, or Firm* — Gardere Wynne Sewell LLP; Chris P. Perque; Teresa J. Lechner-Fish

(57) ABSTRACT

Compositions, synthesis and applications for benzene, furan, thiophene, selenophene, pyrole, pyran, pyridine, oxazole, thiazole and imidazole derivatized anthra[2,3-b:6,7-b'] dithiophene (ADT) based polymers, namely, poly{5,11-bis (5-(2-ethylhexyl)thiophen-2-yl)anthra[2,3-b:6,7-b'] dithiophene-2,8-diyl-alt-2-ethyl-1-(thieno[3,4-b]thiophen-2-yl)hexan-1-one-4,6-diyl}, poly{5,11-bis(5-(2-ethylhexyl) furan-2-yl)anthra[2,3-b:6,7-b']dithiophene-2,8-diyl-alt-2-ethyl-1-(thieno[3,4-b]thiophen-2-yl)hexan-1-one-4,6-diyl and poly{5,11-bis(5-(2-ethylhexyl)selenophen-2-yl)anthra [2,3-b:6,7-b']dithiophene-2,8-diyl-alt-2-ethyl-1-(thieno[3,4-b]thiophen-2-yl)hexan-1-one-4,6-diyl} are disclosed. Further, an organic solar cell constructed of a derivatized anthra [2,3-b:6,7-b']dithiophene (ADT) based polymer is discussed.

15 Claims, 10 Drawing Sheets

| Acceptor | Chemical Structure |
|---|---|
| PC$_{70}$BM | |
| BisIndene-C$_{70}$ | |
| BisPC$_{70}$BM | |
| BisBenzyne-C$_{70}$ | |
| TrisPC$_{70}$BM | |
| PC$_{76}$BM | |

FIG. 5

Table 1: Performance of a ADT-based Solar Cell

| BHJ Layer | Voc (V) | Jsc (mA/cm2) | FF (%) | PCE (%) |
|---|---|---|---|---|
| CS14P:C70 | 0.70 | 4.57 | 29.78 | 0.95 |
| CS14P:C70 | 0.68 ± 0.03 | 4.59 ± 0.33 | 29.67 ± 0.82 | 0.92 ± 0.08 |

FIG. 8

ANTHRADITHIOPHENE-BASED SEMICONDUCTING POLYMERS AND METHODS THEREOF

CROSS-REFERENCE TO RELATED APPLICATIONS

The present application claims priority to U.S. Provisional Patent Application No. 61/907,065, filed on Nov. 21, 2013, for "Anthradithiophene-Based Semiconducting Polymers and Methods Thereof."

TECHNICAL FIELD

This invention relates generally to anthradithiophene (ADT) based conjugated polymer compositions for organic solar cell applications. The invention relates to the composition, synthesis and application of ADT-based conjugated polymers for high efficiency organic solar cell applications.

BACKGROUND OF THE INVENTION

Organic solar cells are being developed for clean renewable energy due to their potential for making cost-effective, large area devices. The performance of solar cells depends on the light-absorbing semiconducting materials. Alternating conjugated polymers based on backbone structures of benzo[1,2-b:3,4-b']dithiophene (BDT) and benzo[1,2-b:3,4-b']dithiophene-thienothiophene (BDT-TT) have demonstrated promising performance in organic solar cell applications. The symmetric, planer structure of BDT provides excellent charge carrier mobility and optical absorption properties to the polymer. However, the BDT conjugated polymer based solar cells are relatively inefficient due to inadequate optical absorption, relatively low charge carrier mobility and non-optimized device morphology.

Anthradithiophene (ADT) has an expanded conjugation system compared to BDT, and ADT-based conjugated polymers would have a further expanded conjugation system compared to BDT-TT. Further, ADT has a suitable highest occupied molecular orbital (HOMO) energy and solid state structure for use as a p-channel thin film transistor (TFT) semiconductor with high mobility. Thus, ADT-based conjugated polymers are needed with a further expanded conjugation system to cover an even broader solar spectrum and with a tuned polymer packing to optimize the device morphology and enhance charge carrier mobility.

SUMMARY OF THE INVENTION

This invention relates generally to anthradithiophene (ADT) based conjugated polymer compositions for organic solar cell applications. The invention relates to the composition, synthesis and application of ADT-based conjugated polymers for high efficiency organic solar cell applications.

To improve the photovoltaic properties of the ADT series polymers, derivative aromatic units such as benzene, furan, thiophene, selenophene, pyrole, pyran, pyridine, oxazole, thiazole, imidazole and derivatives thereof were introduced on ADT segments to expand the optical absorption range to cover a broader spectrum and to tune polymer packing to optimize the device morphology and to enhance charge carrier mobility. Considering that the derivative solubility adopts a sequence of furan>thiophene>selenophene, while their polarizability and ease of charge dissociation reverses this order, a balance of desired derivatized ADT properties may be achieved by finely tuning these derivatives. In the laboratory, the thiophene derivatized ADT-based conjugated polymers compositions achieved power conversion efficiencies (PCE) in the range of about 0.92~1.0% in bulk heterojunction (BHJ) solar cells.

These and other objects, features, and advantages will become apparent as reference is made to the following detailed description, preferred embodiments, and examples, given for the purpose of disclosure, and taken in conjunction with the accompanying drawings and appended claims.

BRIEF DESCRIPTION OF THE DRAWINGS

For a further understanding of the nature and objects of the present invention, reference should be made to the following detailed disclosure, taken in conjunction with the accompanying drawings, in which like parts are given like reference numerals, and wherein:

FIG. 5 illustrates the structures of acceptors, namely, $PC_{70}BM$, BisIndene-$C_{70}$, Bis$PC_{70}BM$, BisBenzene-$C_{70}$, Tris$PC_{70}BM$ and $PC_{76}BM$ according to embodiments of the present invention;

FIG. 8 illustrates a table of performance data for the organic solar cell of FIG. 6.

DETAILED DESCRIPTION OF PREFERRED EMBODIMENTS OF THE INVENTION

The following detailed description of various embodiments of the present invention references the accompanying drawings, which illustrate specific embodiments in which the invention can be practiced. While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which the invention pertains. Therefore, the scope of the present invention is defined only by the appended claims, along with the full scope of equivalents to which such claims are entitled.

This invention discloses compositions, synthesis and applications of anthradithiophene (ADT) based photovoltaic polymers for organic solar cell applications. See FIGS. 1 and 2.

Figure 1:
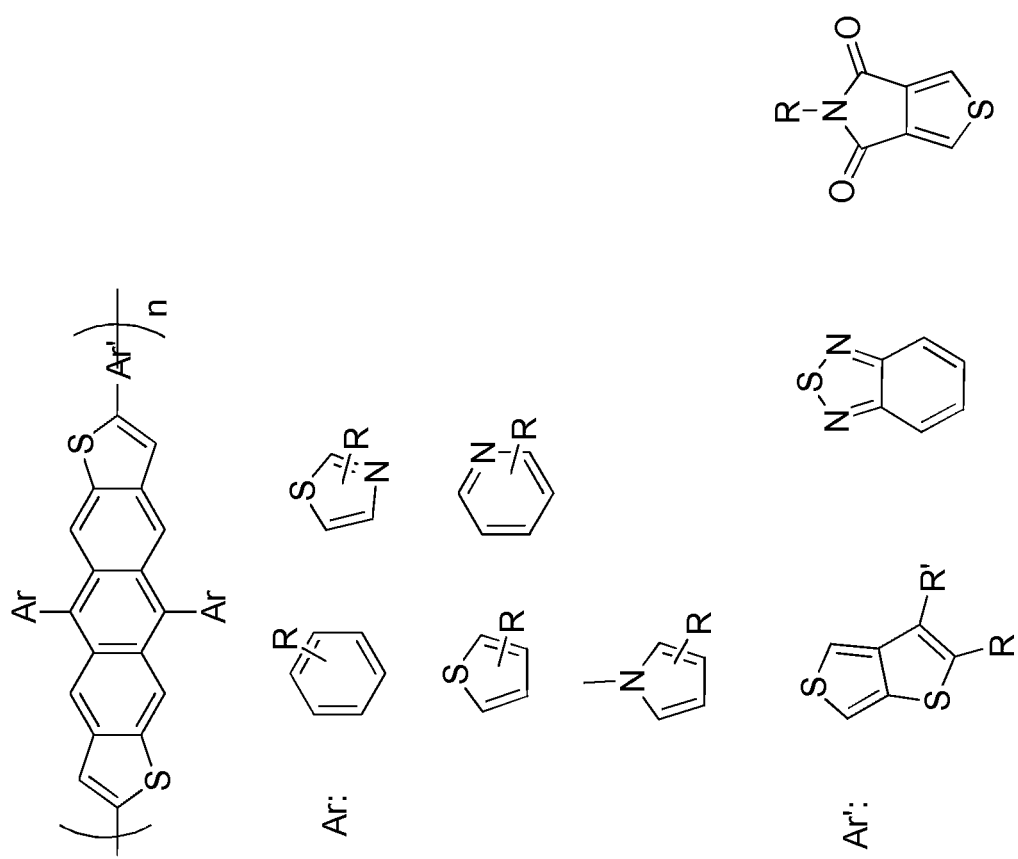
FIG. 1 illustrates structures of various derivatized anthra[2,3-b:6,7-b']dithiophene (ADT) based conjugated polymer compositions according to embodiments of the present invention.

Various structures of benzene, thiophene, pyrole, pyridine, thiazole, and imidazole derivatized ADT-based conjugated monomers are shown in FIG. 1. As illustrated by FIG. 1, the ADT-based polymer has aromatic groups Ar comprising R, and Ar' comprising R and R', wherein Ar may be selected from the group consisting of benzene, furan (not shown), thiophene, selenophene, pyrole, pyran (not shown), pyridine, oxazole (not shown), thiazole, imidazole and derivatives thereof, wherein R may be selected from the group consisting of hydrogen, alkyls and alkoxys, or, alternatively, hydrogen, C1 to C15 alkyls and C1 to C15 alkoxys or, alternatively, C4 to C10 alkyls and C4 to C10 alkoxys, wherein Ar' may be selected from the group consisting of thieno[3,4-b]thiophene, benzothiadiazole, thieno[3,4-c]pyrrole-4,6(5H)-dione and derivatives thereof, wherein R may be selected from the group consisting of hydrogen, alkyls and alkoxys, or, alternatively, hydrogen, C1 to C15 alkyls and C1 to C15 alkoxys or, alternatively, C4 to C10 alkyls and C4 to C10 alkoxys, and wherein R' may be selected from the group consisting of hydrogen, alkyls and alkoxys, or, alternatively, hydrogen, C1 to C15 alkyls and C1 to C15 alkoxys or, alternatively, C4 to C10 alkyls and C4 to C10 alkoxys. In an embodiment, the ADT-based polymer has n repeating units, wherein n may equal from about 1 to about 100, about 1 to about 50 or about 10 to about 30.

In an embodiment, the ADT monomer has an alkyl group Ar comprising R, wherein Ar may be selected from benzene, furan (not shown), thiophene, selenophene, pyrole, pyran (not shown), pyridine, oxazole (not shown), thiazole, imidazole and derivatives thereof. (See FIG. 1). In an embodiment, the benzene derivatized ADT monomer, furan derivatized ADT monomer, thiophene derivatized ADT monomer, selenophene derivatized ADT monomer, pyrole derivatized ADT monomer, pyran derivatized ADT monomer, pyridine derivatized ADT monomer, oxazole derivatized ADT monomer, thiazole derivatized ADT monomer and imidazole derivatized ADT monomer have an alkyl group R, wherein R may be selected from the group consisting of hydrogen, alkyls and alkoxys or, alternatively, hydrogen, C1 to C15 alkyls and C1 to C15 alkoxys, or, alternatively, C4 to C10 alkyls and C4 to C10 alkoxys. (Id.)

Figure 3:
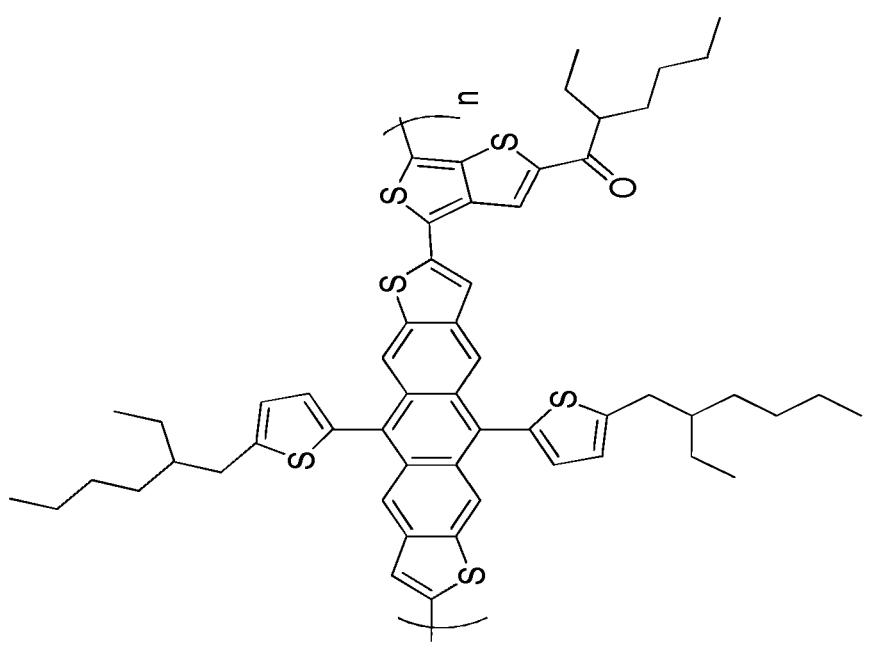
FIG. 3 illustrates an exemplary structure of a thiophene derivatized ADT-based conjugated polymer composition, namely, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} (CS-14P) according to an embodiment of the present invention.

An exemplary structure of a thiophene derivatized ADT-based conjugated polymer, namely, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} (CS-14P) is shown in FIG. 3. This thiophene derivatized ADT-based conjugated polymer among others has been successfully synthesized as discussed below.

A synthesis of various ADT monomers is shown in FIGS. 1 through 2. In an embodiment, the ADT monomer has aromatic groups Ar comprising R, and Ar' comprising R and R', wherein Ar may be selected from the group consisting of benzene, furan (not shown), thiophene, selenophene, pyrole, pyran (not shown), pyridine, oxazole (not shown), thiazole, imidazole and derivatives thereof, wherein R may be selected from the group consisting of hydrogen, alkyls and alkoxys, or, alternatively, hydrogen, C1 to C15 alkyls and C1 to C15 alkoxys or, alternatively, C4 to C10 alkyls and C4 to C10 alkoxys, wherein Ar' may be selected from the group consisting of thieno[3,4-b]thiophene, benzothiadiazole, thieno[3,4-c]pyrrole-4,6(5H)-dione and derivatives thereof, wherein R and R' may be selected from the group consisting of hydrogen, alkyls and alkoxys, or, alternatively, hydrogen, C1 to C15 alkyls and C1 to C15 alkoxys or, alternatively, C4 to C10 alkyls and C4 to C10 alkoxys.

A synthesis of a thiophene derivatized ADT monomer is shown in FIGS. 1 through 2. In an embodiment, the thiophene derivatized ADT monomer has an alkyl group R, wherein R may be selected from the group consisting of hydrogen, alkyls or alkoxys or, alternatively, hydrogen, C1 to C15 alkyls and C1 to C15 alkoxys, or, alternatively, C4 to C10 alkyls and C4 to C10 alkoxys. If sulfur (thiophene) is replaced with oxygen (furan) or selenium (selenophene), a synthesis of furan derivatized ADT (FADT) or selenophene derivatized ADT (SeADT), respectively, is also illustrated by FIGS. 1 through 3.

Thiophene Derivatized ADT-Based Polymer (CS-14P) Example

An exemplary synthesis of a 2-(2-ethylhexyl)thiophene derivatized ADT-based conjugated polymer, namely, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} (CS-14P) is illustrated in FIGS. 1 through 3.

Figure 2A:
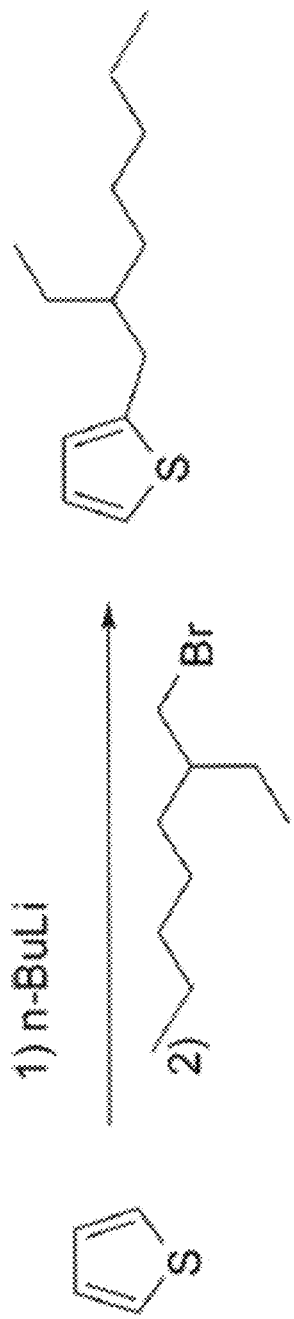
FIG. 2A illustrates an exemplary synthesis of 2-(2-ethylhexyl)thiophene according to an embodiment of the present invention.

In FIG. 2A, an exemplary synthesis of 2-(2-ethylhexyl) thiophene is depicted. As shown in FIG. 2A, a 7.4 mL thiophene was dissolved in 100 mL anhydrous tetrahydrofuran (THF). The solution was then cooled to about −78° C. A 30 mL of 2.5 M n-butyllithium (n-BuLi) in hexane (75 mmol) was added dropwise to the solution. The reaction mixture was warmed to room temperature for about 2 hours, and then cooled to about −15 to about −20° C. 26 mL 2-ethyl bromide was added to the reaction mixture. The reaction mixture was reacted at about 50° C. for about 18 hours, and poured into crushed ice. The organic phase was isolated and washed with water, and extracted with ether three times. After removal of the solvent by rotary evaporator, the residue was distilled under vacuum to get rid of the 2-ethylhexyl bromide. After removal of the 2-ethylhexyl bromide, the residue was purified by elution with hexane by silica gel column chromatography (i.e., about 10 to about 15 cm) to afford 12.6 g 2-(2-ethylhexyl)thiophene as light yellow liquid. The yield was about 85%. The molecular weight was determined by gas chromatography/mass spectrometry (GC-MS) to be 196.3.

Figure 2B:
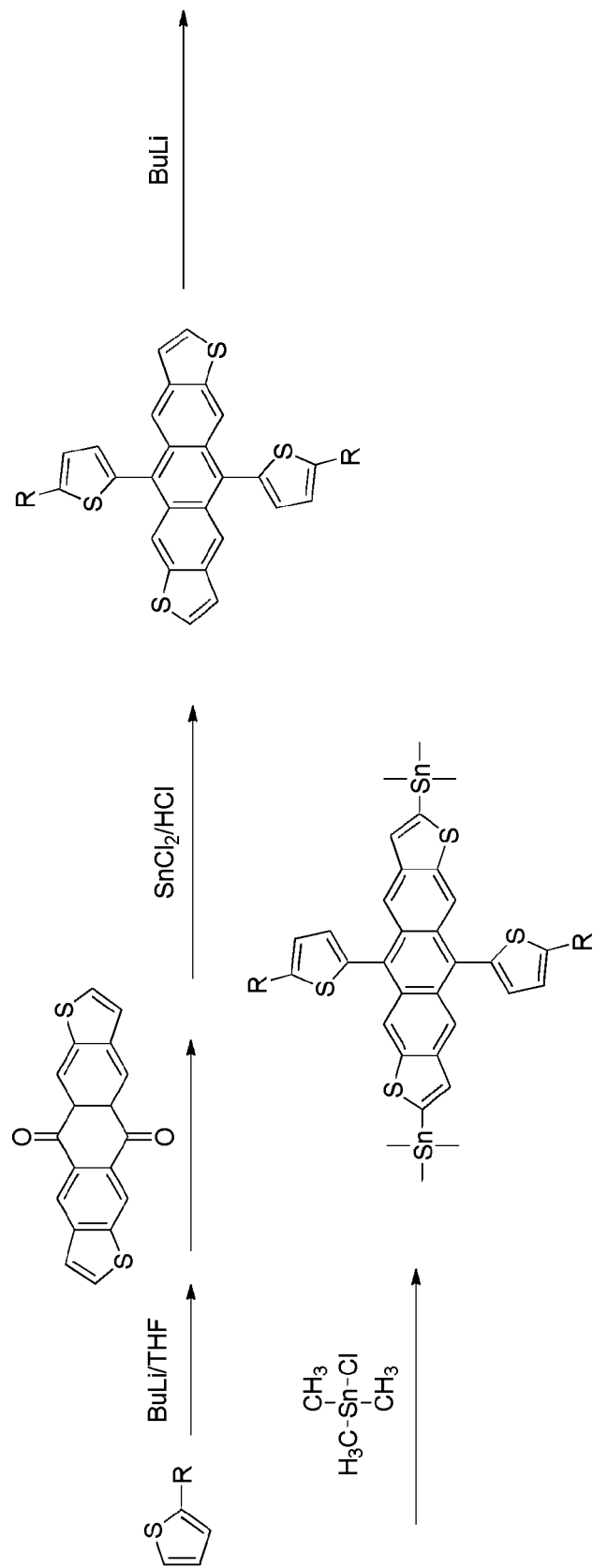
FIG. 2B illustrates an exemplary synthesis of a thiophene derivatized ADT-based conjugated intermediate composition according to an embodiment of the present invention.

In FIG. 2B, an exemplary synthesis of 5,11-bis(5-(2-ethylhexyl)thiophen-2-yl)anthra[2,3-b:6,7-b']dithiophene is depicted. As shown in FIG. 2B, a 2.68 g 2-(2-ethylheptyl)thiophene monomer (about 13.5 mmol) was dissolved in 50 mL of anhydrous THF. Then, the solution was cooled to about −78° C. A 3.90 mL of 2.5 M n-butyllithium (n-BuLi) in hexane (9.75 mmol) was added dropwise to the solution. The reaction mixture was warmed to room temperature for about 2 hours. A 0.445 g anthra[2,3-b:6,7-b']dithiophene-5,11-dione (1.39 mmol) was added in a single portion. Then, the resulting reaction mixture was refluxed at about 65° C. for about 3 hours. After cooling the reaction mixture to about room temperature, 2.80 g Tin(II) chloride dihydrate ($SnCl_2 \cdot 2H_2O$) (12.4 mmol) in 18% aqueous hydrochloric acid (HCl) was added to the reaction mixture. The reaction mixture was stirred at about 40 to about 50° C. overnight. The organic phase was isolated and the water phase was extracted with methylene chloride. After removal of the solvent by rotary evaporator, the residue was purified by elution with hexane by silica gel column chromatography (i.e., about 50 cm) to afford 0.5 g 5,11-bis(5-(2-ethylhexyl)thiophen-2-yl) anthra[2,3-b:6,7-b']dithiophene (FIG. 3) as a red liquid. The yield was about 53%.

In FIG. 2B, an exemplary synthesis of (5,11-bis(5-(2-ethylhexyl)thiophen-2-yl)anthra[2,3-b:6,7-b']dithiophene-2,8-diyl)bis(trimethylstannane) is depicted. As shown in FIG. 2B, a 0.5 g 5,11-bis(5-(2-ethylhexyl)thiophen-2-yl)anthra[2,3-b: 6,7-b']dithiophene (0.737 mmol) was dissolved in 20 mL of anhydrous THF. Then, the solution was cooled in an acetone/dry ice bath to about −78° C. A 0.8 mL of 2.5 M n-butyllithium (n-BuLi) in hexane (2 mmol) was added dropwise to the solution. The reaction mixture was stirred in the acetone/dry ice bath at about −78° C. for about ½ hour before warming the reaction mixture to room temperature for about 2 hours. Then, the reaction mixture was re-cooled in the acetone/dry ice bath to about −78° C. A 2.21 mL of 1.0 M trimethylstannane ($Me_3SnCl$) (2.21 mmol) in THF solution was added dropwise with stirring to the reaction mixture. Then, the reaction mixture was warmed to room temperature and stirred overnight. The reaction mixture was quenched with 50 mL of water and extracted with ether. After solvent removal by rotary evaporator, the residue was re-crystallized in isopropanol to afford 0.366 g (5,11-bis(5-(2-ethylhexyl) thiophen-2-yl)anthra[2,3-b:6,7-b']dithiophene-2,8-diyl)bis (trimethylstannane) (FIG. 2) as a red solid. The yield was about 70%.

Figure 2C:
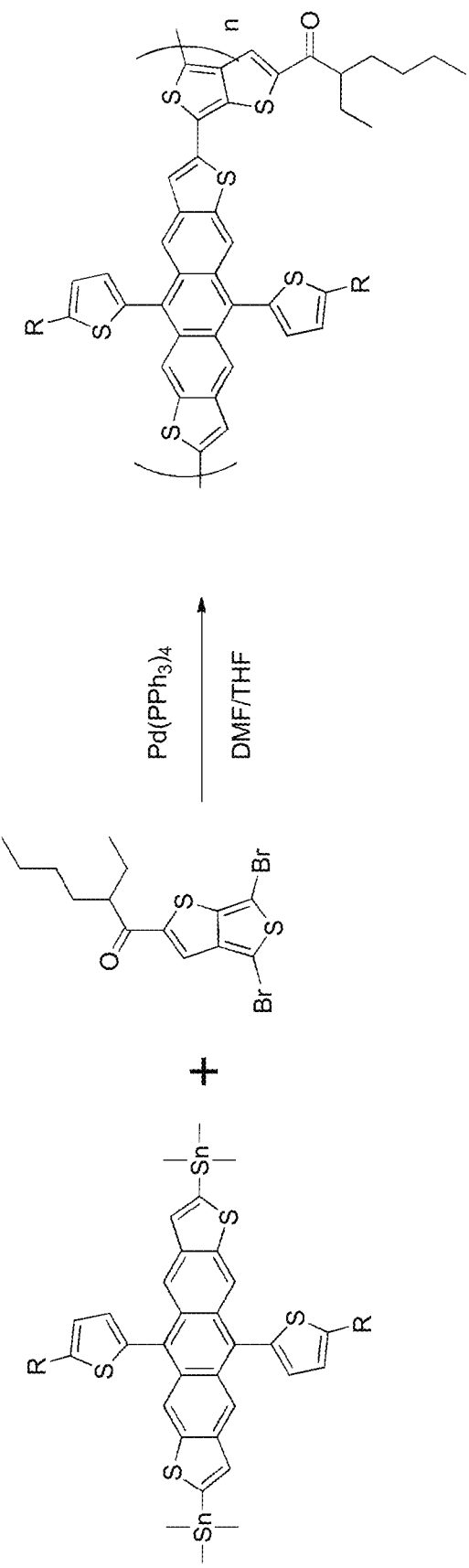
FIG. 2C illustrates an exemplary synthesis of a thiophene derivatized ADT-based conjugated polymer composition according to an embodiment of the present invention.
Figure 4:
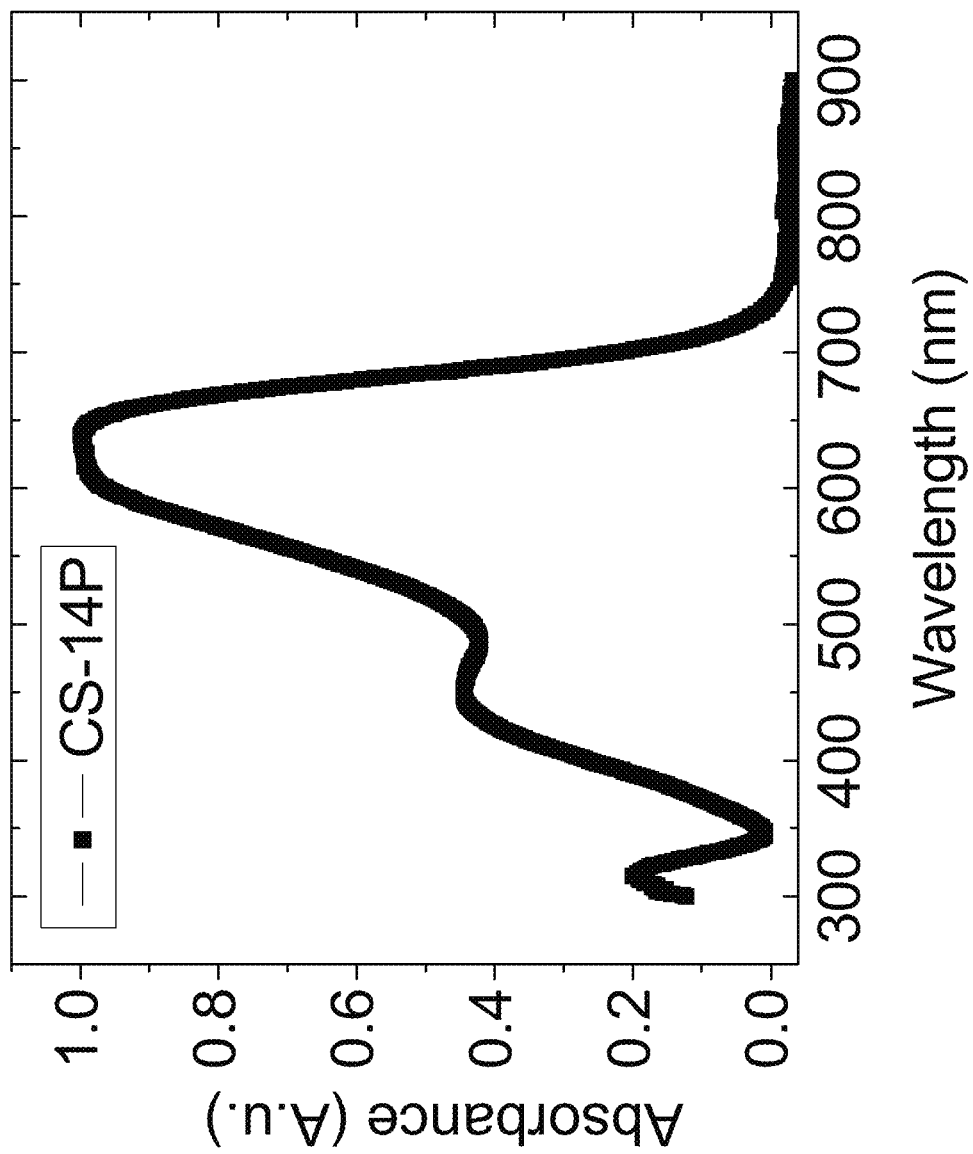
FIG. 4 illustrates a chart of Wavelength (nm) vs. Absorbance (A.u.) for the thiophene derivatized ADT-based conjugated polymer composition of FIG. 3.

In FIGS. 2C and 3, an exemplary synthesis of poly{5,11-bis(5-(2-ethylhexyl)thiophen-2-yl)anthra[2,3-b:6,7-b'] dithiophene-2,8-diyl-alt-2-ethyl-1-(thieno[3,4-b]thiophen-2-yl)hexan-1-one-4,6-diyl} (CS-14P) is depicted. As shown in FIG. 2C, a 0.309 g (5,11-bis(5-(2-ethylhexyl)thiophen-2-yl)anthra[2,3-b:6,7-b']dithiophene-2,8-diyl)bis(trimethylstannane) (0.3075 mmol) and a 0.133 g 1-(4,6-dibromo-thieno[3,4-b]thiophen-2-yl)-2-ethylhexan-1-one (0.3135 mmol) was dissolved in 10 mL toluene with 2 mL dimethylformamide (DMF). The reaction mixture was purged with argon for about 20 minutes. Then, a 16 mg palladium-tetrakis (triphenylphosphine) ($Pd(PPh_3)_4$) catalyst was added to the reaction mixture. After being purged with argon for an additional 20 minutes, the reaction mixture was refluxed for about 16 hours under an argon atmosphere. Then, the reaction mixture was cooled to room temperature. The polymer was precipitated by addition of 100 mL methanol. The polymer precipitate was re-dissolved in chloroform and the polymer was re-precipitated by addition of hexane. The polymer residue was dried over vacuum to afford a 0.225 g of CS-14P polymer (FIGS. 2C and 3). The yield was about 75%. The structure of CS-14P was determined by UV-visible absorption spectroscopy. See FIG. 4.

If sulfur (thiophene) is replaced with oxygen (furan) in the CS-14P, an exemplary synthesis of a furan derivatized ADT, namely, poly{5,11-bis(5-(2-ethylhexyl)furan-2-yl)anthra[2, 3-b:6,7-b']dithiophene-2,8-diyl-alt-2-ethyl-1-(thieno[3,4-b] thiophen-2-yl)hexan-1-one-4,6-diyl} synthesis is also illustrated by FIGS. 1 through 3.

Further, if sulfur (thiophene) is replaced with selenium (selenophene) in the CS-14P, an exemplary synthesis of a selenophene derivatized ADT, namely, poly{5,11-bis(5-(2-ethylhexyl)selenophen-2-yl)anthra[2,3-b:6,7-b'] dithiophene-2,8-diyl-alt-2-ethyl-1-(thieno[3,4-b]thiophen-2-yl)hexan-1-one-4,6-diyl} is illustrated by FIGS. 1 through 3.

Device Fabrication and Characterization

Figure 6:
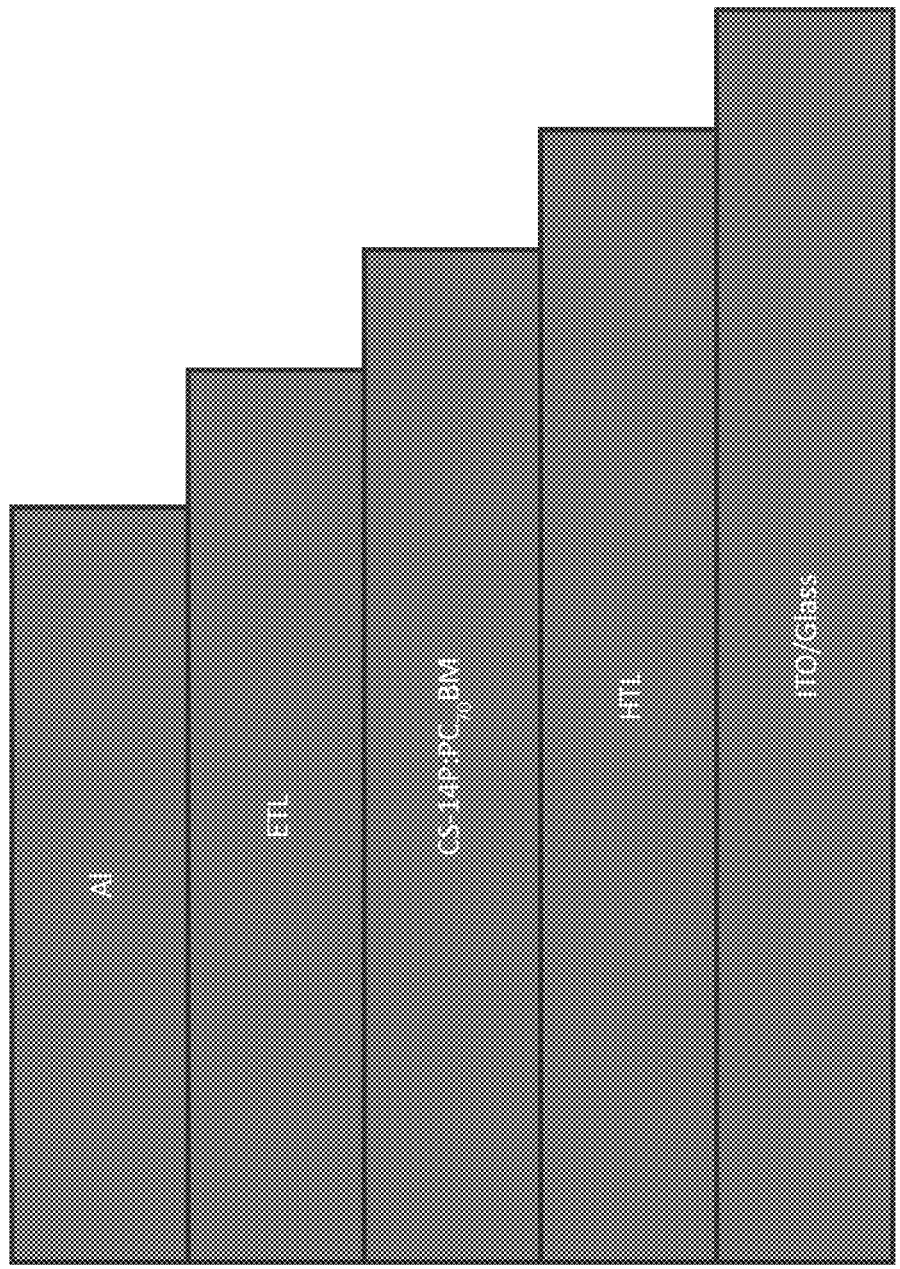
FIG. 6 illustrates a structure of an organic solar cell using poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} (CS-14P) polymer composition of FIG. 3 as a donor and a $PC_{70}BM$ of FIG. 5 as an acceptor in the bulk heterojunction layer.

An organic solar cell structure is illustrated in FIG. 6, wherein Al is an aluminum layer (anode), ETL is an electron transport layer (acceptor), HTL is a hole transport layer (donor), ITO/glass is an indium tin oxide glass layer (cathode). In an embodiment, Al may be substituted with Ag, wherein Ag is a silver layer (anode). In an embodiment, the bulk heterojunction (BHJ) material is constructed from a donor and an acceptor. Suitable donors include ADT-based conjugated polymers. The structures for these donors are illustrated in FIG. 1. Suitable acceptors include $PC_{70}BM$, BisIndene-$C_{70}$, $BisPC_{70}BM$, BisBenzene-$C_{70}$, $TrisPC_{70}BM$ and $PC_{76}BM$. The structures for these acceptors are illustrated in FIG. 5.

In an example, a bulk heterojunction (BHJ) layer was constructed from a donor, namely, an ADT-based conjugated polymer and an acceptor, namely, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl}:[6,6]-phenyl $C_{70}$-butyric acid methyl ester (CS-14P:$PC_{70}BM$) as illustrated in FIGS. 3, 5 and 6. If sulfur (thiophene) is replaced with oxygen (furan) or selenium (selenophene) in the CS-14P, a BHJ layer constructed from a donor, furan derivatized ADT or selenophene derivatized ADT, respectively, and an acceptor, namely, poly{5,11-bis(5-(2-ethylhexyl)furan-2-yl)anthra[2,3-b:6,7-b'] dithiophene-2,8-diyl-alt-2-ethyl-1-(thieno[3,4-b]thiophen-2-yl)hexan-1-one-4,6-diyl}:$PC_{70}BM$ or poly{5,11-bis(5-(2-ethylhexyl)selenophen-2-yl)anthra[2,3-b:6,7-b'] dithiophene-2,8-diyl-alt-2-ethyl-1-(thieno[3,4-b]thiophen-2-yl)hexan-1-one-4,6-diyl}:$PC_{70}BM$ is also illustrated by FIGS. 3, 5 and 6.

In an example, organic solar cells were constructed from the CS-14P:$PC_{70}BM$ BHJ layer (FIGS. 3, 5 and 6). Poly{5, 11-bis(5-(2-ethylhexyl)thiophen-2-yl)anthra[2,3-b:6,7-b'] dithiophene-2,8-diyl-alt-2-ethyl-1-(thieno[3,4-b]thiophen-2-yl)hexan-1-one-4,6-diyl} (CS-14P) and [6,6]-phenyl $C_{70}$-butyric acid methyl ester ($PC_{70}BM$) were dissolved in chlorobenzene, dichlorobenzene, and o-xylene in about 1:1.5 (10 mg/mL:15 mg/mL) or about 1:2 (10 mg/mL:20 mg/mL) weight ratios, respectively. The solutions were stirred at about 70° C. overnight and, then, filtered using a 0.45 μm polytetrafluoroethylene (PTFE) filter. Prior to use, 3% volume ratio of 1,8-diiodooctane (Sigma Aldrich) was added to the solutions. The solutions were left to stir on a hotplate at about 50° C. prior to use.

Indium tin oxide (ITO) patterned glass substrates (ITO/glass substrates) were cleaned by sonication using the following solvents for each step: acetone, isopropanol, detergent water, deionized water, acetone, and isopropanol. The clean ITO/glass substrates were left to dry in an oven.

PEDOT/PSSA was spin coated onto the ITO/glass substrates at about 4000 rpm for about 20 seconds. Then, the active layer solutions were spin coated onto the CS-14P:PC70BM coated ITO/glass substrates. The coated CS-14P:PC70BM/ITO/glass substrates were left to solvent anneal in plastic petri dishes for about 1 hour.

A 200 Å of calcium and a 800 Å layer of aluminum (anode) was coated on the CS-14P:PC70BM/ITO/glass substrates, respectively, for the electrodes by thermal evaporation. The resulting organic solar cells were encapsulated prior to removing them from a glove box for testing.

Figure 7:
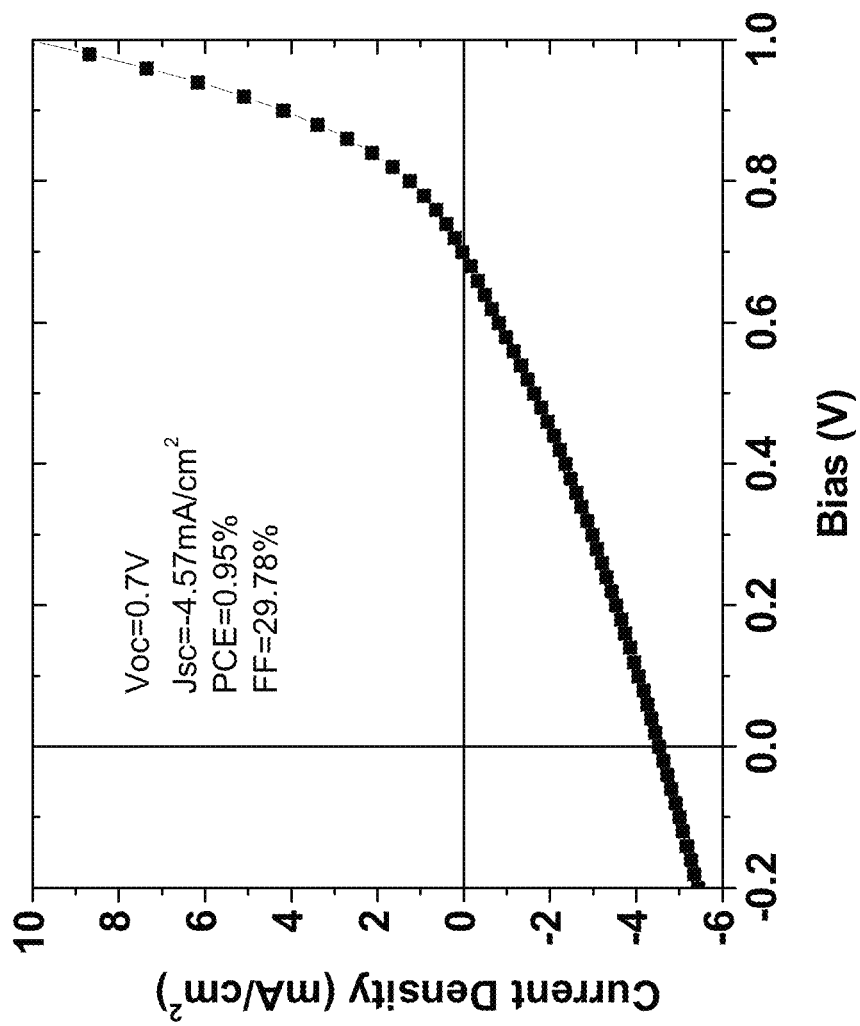
FIG. 7 illustrates a chart of Bias (V) vs. Current Density ($mA/cm^2$) for the organic solar cell of FIG. 6.

The organic solar cells with active area of 0.095 $cm^2$ were tested using AM 1.5G irradiation (100 mW/$cm^2$) solar simulator. As shown in FIG. 7, a bias voltage from about −0.2 to about 1.0 V was applied to the solar cells. The solar cells produced a current density from about −5.5 to about 7.8 mA/$cm^2$. See FIGS. 7 and 8. The open circuit voltage (Voc)

was 0.7 V, short circuit current density (Jsc) was 4.57 mA/cm$^2$, fill factor (FF) was 29.78% and power conversion efficiency was 0.95%. Id. The fill factor (FF) is defined as the ratio of the maximum obtainable power to the product of the open circuit voltage (Voc) and short circuit current (Jsc):

FF=maximum obtainable power/(Voc*Jsc).

In other similar experiments, the open circuit voltage (Voc) was 0.68±0.03 V, short circuit current density (Jsc) was 4.59±0.33 mA/cm$^2$, fill factor (FF) was 29.67±0.82% and power conversion efficiency was 0.92±0.08% (i.e., as high as 1.0%). See FIG. 8.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

DEFINITIONS

As used herein, the terms "a," "an," "the," and "said" means one or more.

As used herein, the term "about" means the stated value plus or minus a margin of error or plus or minus 10% if no method of measurement is indicated.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, the terms "comprising," "comprises," and "comprise" are open-ended transition terms used to transition from a subject recited before the term to one or more elements recited after the term, where the element or elements listed after the transition term are not necessarily the only elements that make up the subject.

As used herein, the terms "containing," "contains," and "contain" have the same open-ended meaning as "comprising," "comprises," and "comprise," provided above.

As used herein, the terms "having," "has," and "have" have the same open-ended meaning as "comprising," "comprises," and "comprise," provided above.

As used herein, the terms "including," "includes," and "include" have the same open-ended meaning as "comprising," "comprises," and "comprise," provided above.

As used herein, the phrase "consisting essentially of" occupies a middle ground, allowing the addition of non-material elements that do not substantially change the nature of the invention, such as various buffers, differing salts, extra wash or precipitation steps, pH modifiers, and the like.

As used herein, the phrase "consisting of" is a closed transition term used to transition from a subject recited before the term to one or more material elements recited after the term, where the material element or elements listed after the transition term are the only material elements that make up the subject.

As used herein, the term "simultaneously" means occurring at the same time or about the same time, including concurrently.

INCORPORATION BY REFERENCE

All patents and patent applications, articles, reports, and other documents cited herein are fully incorporated by reference to the extent they are not inconsistent with this invention.

What is claimed is:

1. A derivatized anthra[2,3-b:6,7-b']dithiophene (ADT) based monomer having the formula

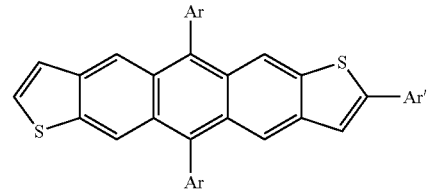

wherein Ar is selected from the group consisting of benzene, furan, thiophene, selenophene, pyrole, pyran, pyridine, oxazole, thiazole, imidazole and derivatives thereof, wherein Ar' is selected from the group consisting of thieno[3,4-b] thiophene, benzothiadiazole, thieno[3,4-c]pyrrole-4,6(5H)-dione and derivatives thereof.

2. The derivatized anthra[2,3-b:6,7-b']dithiophene based monomer of claim 1, wherein Ar is selected from the group consisting of benzene, thiophene, pyrole, pyridine, thiazole and derivatives thereof.

3. The derivatized anthra[2,3-b:6,7-b']dithiophene based monomer of claim 1, wherein Ar is selected from the group consisting of thiophene and derivatives thereto.

4. The derivatized anthra[2,3-b:6,7-b']dithiophene based monomer of claim 1, wherein Ar is selected from the group consisting of furan and derivatives thereto.

5. The derivatized anthra[2,3-b:6,7-b']dithiophene based monomer of claim 1, wherein Ar is selected from the group consisting of selenophene and derivatives thereto.

6. The derivatized anthra[2,3-b:6,7-b']dithiophene based monomer of claim 1, wherein Ar comprises R selected from the group consisting of hydrogen, C1 to C15 alkyls and C1 to C15 alkoxys; and wherein Ar' comprises R and R' both selected from the group consisting of hydrogen, C1 to C15 alkyls and C1 to C15 alkoxys.

7. The derivatized anthra[2,3-b:6,7-b']dithiophene based monomer of claim 1, wherein Ar comprises R selected from the group consisting of C4 to C10 alkyls and C4 to C10 alkoxys; and wherein Ar' comprises R and R' both selected from the group consisting of C4 to C10 alkyls and C4 to C10 alkoxys.

8. The derivatized anthra[2,3-b:6,7-b']dithiophene based monomer of claim 1, wherein the derivatized anthra[2,3-b:6,7-b']dithiophene based monomer is formed into a derivatized anthra[2,3-b:6,7-b']dithiophene based polymer having the formula

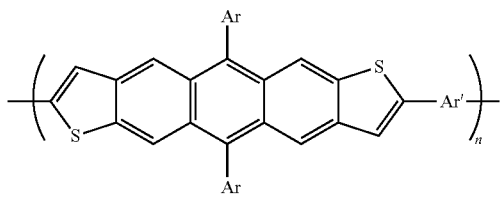

wherein n is equal to 1 to 100.

9. The derivatized anthra[2,3-b:6,7-b']dithiophene based polymer of claim 8, wherein n is equal to 1 to 50.

10. A bulk heterojunction material, comprising:
a) at least one derivatized anthra[2,3-b:6,7-b'] based polymer as in claim 1 as a donor; and
b) an acceptor.

11. The bulk heterojunction material of claim 10, wherein the anthra[2,3-b:6,7-b']dithiophene based polymer is selected from the group consisting of poly{5,11-bis(5-(2-ethylhexyl)furan-2-yl)anthra[2,3-b:6,7-b']dithiophene-2,8-diyl-alt-2-ethyl-1-(thieno[3,4-b]thiophen-2-yl)hexan-1-one-4,6-diyl}, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} and poly{5,11-bis(5-(2-ethylhexyl) selenophen-2-yl)anthra[2,3-b:6,7-b']dithiophene-2,8-diyl-alt-2-ethyl-1-(thieno[3,4-b]thiophen-2-yl)hexan-1-one-4,6-diyl}.

12. The bulk heterojunction material of claim 10, wherein the acceptor is selected from the group consisting of $PC_{70}BM$, BisIndene-$C_{70}$, BisPC$_{70}$BM, BisBenzene-$C_{70}$, TrisPC$_{70}$BM and PC$_{76}$BM.

13. An organic solar cell device comprising:
a) an aluminum or silver layer;
b) a bulk heterojunction layer, wherein the bulk heterojunction layer comprises:
  i. at least one derivatized anthra[2,3-b:6,7-b'] dithiophene based polymer as in claim 1 as a donor; and
  ii. an acceptor; and
c) an indium tin oxide glass layer.

14. The organic solar cell device of claim 13, wherein the anthra[2,3-b:6,7-b']dithiophene based polymer is selected from the group consisting of poly{5,11-bis(5-(2-ethylhexyl)furan-2-yl)anthra[2,3-b:6,7-b']dithiophene-2,8-diyl-alt-2-ethyl-1-(thieno[3,4-b]thiophen-2-yl)hexan-1-one-4,6-diyl}, poly{5,11-bis(5-(2-ethylhexyl)thiophen-2-yl)anthra[2,3-b:6,7-b']dithiophene-2,8-diyl-alt-2-ethyl-1-(thieno[3,4-b]thiophen-2-yl)hexan-1-one-4,6-diyl} and poly{5,11-bis(5-(2-ethylhexyl) selenophen-2-yl)anthra[2,3-b:6,7-b']dithiophene-2,8-diyl-alt-2-ethyl-1-(thieno[3,4-b]thiophen-2-yl)hexan-1-one-4,6-diyl}.

15. The organic solar cell device of claim 13, wherein the acceptor is selected from the group consisting of $PC_{70}BM$, BisIndene-$C_{70}$, BisPC$_{70}$BM, BisBenzene-$C_{70}$, TrisPC$_{70}$BM and PC$_{76}$BM.

* * * * *